(12) United States Patent
Kusuura

(10) Patent No.: US 8,058,548 B2
(45) Date of Patent: Nov. 15, 2011

(54) VARIABLE LIGHT CONDENSING LENS APPARATUS AND SOLAR CELL APPARATUS

(75) Inventor: Takahisa Kusuura, Kawasaki (JP)

(73) Assignee: Empire Technology Development LLC, Wilmington, DE (US)

( * ) Notice: Subject to any disclaimer, the term of this patent is extended or adjusted under 35 U.S.C. 154(b) by 65 days.

(21) Appl. No.: 12/665,015

(22) PCT Filed: Feb. 4, 2009

(86) PCT No.: PCT/JP2009/051860
§ 371 (c)(1),
(2), (4) Date: Apr. 7, 2010

(87) PCT Pub. No.: WO2010/089859
PCT Pub. Date: Aug. 12, 2010

(65) Prior Publication Data
US 2011/0108110 A1     May 12, 2011

(51) Int. Cl.
*H01L 31/0232* (2006.01)
*H01L 31/0216* (2006.01)

(52) U.S. Cl. .......... 136/246; 136/259; 136/256; 438/64

(58) Field of Classification Search .................. None
See application file for complete search history.

(56) References Cited

U.S. PATENT DOCUMENTS
2008/0264411 A1* 10/2008 Beranek ............. 126/710

FOREIGN PATENT DOCUMENTS
| JP | 2000-070707 | 3/2000 |
|---|---|---|
| JP | 2000-071184 | 3/2000 |
| JP | 2001-129474 | 5/2001 |
| JP | 2003-046103 | 2/2003 |
| JP | 2006-147344 | 6/2006 |
| WO | WO 96/29375 | 9/1996 |

OTHER PUBLICATIONS

International Search Report for PCT/JP2009/051860 mailed May 12, 2009.
Office Action for Japanese Patent Appl. No. 2009-539561 dated Jun. 14, 2010 (with English translation).
Dictionary of Electrical Engineering No. 13, "Illumination," Institute of Electrical Engineers of Japan, Corona Publishing Co., Ltd., Jul. 1996, 1 page (with English translation).
Japanese Patent Office homepage, "Solar Cell, 1.3.5 Condensing Type Solar Cell," Jan. 20, 2009, (http://www.jpo.go.jp/shiryou/s_sonota/map/kagaku01/1/1-3-5.htm), 1 page (with English translation).
International Preliminary Report on Patentability for Intl. Pat. Appln. No. PCT/JP2009/051860, mailed on Aug. 18, 2011, 7 pp.

* cited by examiner

*Primary Examiner* — Jennifer K. Michener
*Assistant Examiner* — Jayne Mershon
(74) *Attorney, Agent, or Firm* — Foley & Lardner LLP

(57) ABSTRACT

It is desirable to provide a variable light condensing lens apparatus and a solar cell apparatus provided therewith in a simple configuration, yet capable of reducing dependency of light condensing efficiency on the angle of incidence of light and thereby improving power generation efficiency of the solar cell apparatus. The variable light condensing lens apparatus according to the present disclosure is provided with a translucent support having a hydrophilic photocatalyst on a surface thereof and a first translucent liquid supported on the surface of the translucent support in contact therewith and the solar cell apparatus according to the present disclosure is provided with a solar cell element, a pair of electrodes connected to the solar cell element and the variable light condensing apparatus according to the present disclosure disposed opposed to the solar cell element.

11 Claims, 3 Drawing Sheets

VARIABLE LIGHT CONDENSING LENS APPARATUS AND SOLAR CELL APPARATUS

CROSS-REFERENCE TO RELATED APPLICATIONS

The present application is a U.S. national stage application claiming the benefit of International Application No. PCT/JP2009/051860, filed on Feb. 4, 2009, the entire contents of which is incorporated herein by reference in its entirety.

TECHNICAL FIELD

The present disclosure relates to a variable light condensing lens apparatus and a solar cell apparatus.

BACKGROUND ART

Generally, solar cell apparatuses are roughly divided into apparatuses of a so-called flat plate type where natural light from the sun is directly impinged on an element to generate electric power and apparatuses of a so-called light condensing type where natural light is condensed using an optical system to increase a luminous flux density or illuminance (luminous intensity) (hereinafter, collectively simply referred to as "luminous flux density") and is then impinged on an element to generate electric power.

There are widely used schemes of the condensing type solar cell apparatuses such as a lens scheme in which light is condensed using lenses such as a circular Fresnel lens (focus scheme), a reflector scheme in which light is condensed using a parabolic mirror or side mirror and a scheme combining these two schemes. Furthermore, a light absorption/light emission scheme is also known whereby sunlight is absorbed by a light absorber/illuminant containing inorganic ions or organic dye without using any optical system and the light emitted from the light absorber/illuminant is introduced into an element (e.g., see Non-Patent Document 1).

Non-Patent Document 1: Japanese Patent Office homepage http://www.jpo.go.jp/shiryou/s_sonota/map/kagaku04/1/1-3-5.htm "Solar Cell, 1.3.5 Condensing Type Solar Cell" (as of Jan. 20, 2009)

DISCLOSURE OF THE INVENTION

Problems to be Solved by the Invention

However, regarding the lens-type apparatuses among the above described conventional condensing type solar cell apparatuses, since the light condensing efficiency depends on an angle formed by light incident on the lens, the light condensing efficiency may conversely deteriorate depending on the angle of incidence compared to a case where no lens is used. That is, the angle of incidence of sunlight falling onto the surface of the Earth varies with seasons and time of the day and considerably varies depending on regions, and therefore when a lens designed to be able to condense more sunlight having a small angle of incidence upon the solar cell apparatus and having small illuminance with which the solar cell is illuminated (sunlight at dawn or in the evening) is used, the light condensing efficiency of sunlight having a large angle of incidence and a large luminous flux density with which the solar cell is illuminated (sunlight in the daytime) conversely deteriorates compared to a case where no such lens is used.

On the other hand, the reflector-type apparatuses inherently have a lower light condensing efficiency than that of the lens-type apparatuses and need to provide a reflector such as a parabolic mirror or a side mirror around the element, which may cause the installation space of the entire solar cell apparatus to increase and reduce the allocation efficiency, resulting in a reduction in the amount of power generated per unit area.

Moreover, the light absorption/light emission type, apparatuses guide light emitted from the light absorber/illuminant to the element using an optical system, which makes the apparatus configuration more complicated, resulting in a disadvantage that it is necessary to optimize the optical system depending on the unit structure or integrated structure of the element and configuration of the solar cell module or solar cell panel or the like.

Thus, it is desirable to provide a variable light condensing lens apparatus and a solar cell apparatus provided therewith in a simple configuration, yet capable of reducing dependency of light condensing efficiency on an angle of incidence of light and thereby improving power generation efficiency of the solar cell apparatus.

Means for Solving the Problems

In order to solve the above described problems, the variable light condensing apparatus according to the present disclosure is provided with a translucent (transparent) support having a hydrophilic photocatalyst on a surface thereof and a first translucent (transparent) liquid supported on the surface of the translucent support in contact therewith.

In such a configuration, the first translucent liquid is supported (held) on the translucent support with the first translucent liquid contacting the hydrophilic photocatalyst provided on the surface of the translucent support. Here, the hydrophilic photocatalyst manifests hydrophilicity according to a wavelength and intensity of light, that is, its hydrophilicity significantly increases when irradiated with light having a predetermined wavelength (responsive wavelength of hydrophilic photocatalyst) and intensity compared to when not irradiated with such light. Therefore, when the hydrophilic photocatalyst in contact with the translucent support is irradiated with light of the predetermined wavelength at a predetermined luminous flux density or higher, wettability between the first translucent liquid and the surface of the translucent support is increased significantly and the first translucent liquid spreads over the surface of the translucent support and becomes distributed uniformly without forming any water droplets caused by surface tension, that is, without being formed into any convex lens shape.

Therefore, as the angle at which light such as sunlight impinges on the translucent support approaches a large angle close to the right angle (angle close to 90°) and as the luminous flux density increases, the first translucent liquid becomes spread and distributed without being formed into any lens shape, and therefore the incident light having a large luminous flux density penetrates the first translucent liquid and the translucent support without being bent in the first translucent liquid. If a solar cell element is arranged after the translucent support, incident light (sunlight) impinges on the solar cell element without any reduction in the luminous flux density, and therefore desired power is generated through a photoelectric effect (photovoltaic effect). By contrast, if, for example, a convex lens that condenses light with a small angle of incidence is provided before the solar cell element as in the case of the prior art, light at an angle of incidence close to the right angle may be more likely to be bent and scattered as the distance from the center of the lens increases.

On the other hand, when the hydrophilic photocatalyst is irradiated with light of a predetermined wavelength at less than a predetermined luminous flux density, the hydrophilic photocatalyst does not manifest hydrophilicity and becomes relatively hydrophobic, and so the wettability between the first translucent liquid and the surface of the translucent support does not increase, the first translucent liquid forms water droplets (that is, forms a convex lens shape) and is held on the surface of the translucent support.

That is, as the angle at which light such as sunlight impinges on the translucent support is reduced to a small angle close to the horizontal direction (angle close to 0° or 180°) and as the luminous flux density decreases, the first translucent liquid becomes distributed in a lens shape, and therefore the incident light having such a small luminous flux density is bent in the first translucent liquid, or in other words, condensed, penetrates the first translucent liquid and the translucent support with its luminous flux density increased. Therefore, if the solar cell element is arranged after the translucent support, a greater amount of power is generated compared to when there is no first translucent liquid.

Here, "hydrophilicity" means "affinity" with the first translucent liquid. Furthermore, the hydrophilic photocatalyst need not be provided on the entire surface of the translucent support, and needs only to be provided at least in a region where the hydrophilic photocatalyst contacts the first translucent liquid and may be formed in a layered shape or may be densely spotted.

Furthermore, the "predetermined luminous flux density" differs depending on the type of hydrophilic photocatalyst and amount (area of contact with the first translucent liquid), type of the first translucent liquid and amount thereof (mass) or the like, and more strictly means the luminous flux density at the position (plane) of the hydrophilic photocatalyst irradiated from the standpoint of action, but may also be defined as a luminous flux density at an appropriate position such as the vicinity of a place where the hydrophilic photocatalyst is provided. For example, using the luminous flux density as a boundary (threshold), correlation data indicating that a significant lens is formed by the first translucent liquid when the luminous flux density is equal to or above the threshold, and no significant lens is formed by the first translucent liquid when the luminous flux density is less than the threshold, may be obtained experimentally or by a numerical value simulation or the like beforehand and may be empirically determined.

In other words, the first translucent liquid can be said to form a condensing lens when the hydrophilic photocatalyst is irradiated with light at a predetermined luminous flux density or higher and not to form a condensing lens when the hydrophilic photocatalyst is irradiated with light at less than the predetermined luminous flux density.

To be more specific, the variable light condensing apparatus may be provided with a cell containing a translucent support and since the first translucent liquid supported by the translucent support is held within the cell, it is possible to prevent vaporization of the first translucent liquid and facilitate the reuse of the first translucent liquid in this case.

Furthermore, the first translucent liquid is not particularly limited as long as it is translucent and manifests affinity with the hydrophilic photocatalyst, and, for example, a polar solution (solvent) may be used, and, to be more specific, water or an aqueous solution may be taken as an example.

Furthermore, the variable light condensing apparatus may be further provided with a second translucent liquid which has lower specific gravity than that of the first translucent liquid, has non-affinity with the first translucent liquid and contacts the first translucent liquid. In this case, oil or a non-polar solution (solvent) may be used as the second translucent liquid.

Thus, the first translucent liquid may be configured so as to be covered with the second translucent liquid in the vertical direction and if, for example, the first translucent liquid and the second translucent liquid are charged and sealed into the aforementioned cell, vaporization of the first translucent liquid in the space of the cell can be reliably prevented and the first translucent liquid can be more simply shaped, and therefore this is preferable.

More specifically, a configuration in which light has a wavelength in an ultraviolet region (that is, ultraviolet light) and the hydrophilic photocatalyst is of an ultraviolet photoresponsive (photosensitive) type or light has a wavelength in a visible region (that is, visible light) and the hydrophilic photocatalyst is of a visible photoresponsive (photosensitive) type can be taken as an example.

Here, the "wavelength" in the ultraviolet region refers to a wavelength of "ultraviolet radiation" described in International lighting vocabulary, 4th ed. (Joint publication IEC/CIE) cited in Dictionary of Electrical Engineering No. 13 "Illumination," Institute of Electrical Engineers of Japan (Corona Publishing Co., Ltd.: revised in July 1996), and to be more specific, refers to a wavelength of 100 to 400 nm including UV-A, UV-B and UV-C. Furthermore, the "wavelength in a visible region" refers to, for example, the wavelength of "visible radiation" in the same document and to be more specific, refers to 360 nm, which is a lower limit of short wavelength, to 830 nm, which is an upper limit of long wavelength.

Furthermore, to be more specific, examples of the hydrophilic photocatalyst include $TiO_2$, $BaTiO_3$, $SrTiO_3$, $BaZrO_3$, $SrZrO_3$ or $Ge_3N_4$ doped or not doped with N, S or C (for details of types of photocatalysts or the like, see, for example, "Visible Photoresponsive Type Photocatalyst"—All from Material Design to Commercialization; CMC Publishing CO., LTD. Sep. 30, 2005, first edition).

Furthermore, the solar cell apparatus according to the present disclosure is provided with the variable light condensing apparatus according to the present disclosure, that is, provided with the variable light condensing apparatus including a solar cell element, a pair of electrodes connected to the solar cell element, a translucent support having a hydrophilic photocatalyst on a surface thereof and a first translucent liquid supported on the surface of the translucent support in contact therewith, and disposed opposed to the solar cell element.

Illustrating more specifically, a solar cell apparatus is provided which includes a solar cell element, a pair of electrodes connected to the solar cell apparatus, a translucent support having a hydrophilic photocatalyst on a surface thereof and a first translucent liquid supported on the surface of the translucent support in contact therewith, includes a variable light condensing apparatus disposed opposed to the solar cell element, wherein the hydrophilic photocatalyst is $TiO_2$, $BaTiO_3$, $SrTiO_3$, $BaZrO_3$, $SrZrO_3$ or $Ge_3N_4$ doped or not doped with N, S or C and hydrophilicity thereof increases when irradiated with light having a predetermined wavelength compared to when not irradiated with such light, the first translucent liquid is water or an aqueous solution, a condensing lens is formed when the hydrophilic photocatalyst is irradiated with light at a predetermined luminous flux density or higher, whereas no condensing lens is formed when the hydrophilic photocatalyst is irradiated with light at less than the predetermined luminous flux density.

BEST MODE FOR CARRYING OUT THE INVENTION

Hereinafter, embodiments of the present invention will be explained in detail. The same elements will be assigned the same reference numerals and overlapping explanations thereof will be omitted. Furthermore, suppose a positional relationship of up, down, left and right or the like is based on the positional relationship shown in the drawings unless specified otherwise. Furthermore, the dimensional ratio in the drawings is not limited to the ratio in the drawings. Furthermore, the following embodiments are intended to illustrate the present disclosure but not intended to limit the present disclosure to only the embodiments. Moreover, the present disclosure can be modified in various ways without departing from the spirit and scope thereof.

Both FIG. 1 and FIG. 2 are cross-sectional views schematically illustrating a configuration of a preferred embodiment of a solar cell apparatus using an example of a variable light condensing apparatus according to the present disclosure, FIG. 1 illustrates a situation in which light such as sunlight impinges on the apparatus from substantially right above in the figure and FIG. 2 illustrates a situation in which light such as sunlight impinges on the apparatus from diagonally above in the figure.

A solar cell apparatus 1 is made up of a variable light condensing apparatus 20 set up on a solar cell section 10. The solar cell section 10 is configured such that a solar cell element 13 having a photoelectric effect is separately formed on an electrode 12a made of a translucent conductor such as ITO separately formed on a substrate 11 made of a metal conductor such as stainless steel and an insulator such as glass or ceramics and an electrode 12b made of a translucent conductor such as ITO is further formed on an upper wall and a side wall thereof and the whole thereof in that condition is covered with an insulator 14 such as resin having translucency (transparency). The electrodes 12a and 12b are connected in series at their respective ends, and the electrodes 12a and 12b, and solar cell elements 13 extend in the depth direction of the surface of the sheet in the respective drawings. Thus, the solar cell section 10 constitutes an integrated solar cell.

To form such an integrated solar cell section 10, for example, a publicly known metal mask scheme, patterning scheme using laser (abrasion) or the like can be used. Schematically describing, the metal mask scheme is a method of sequentially stacking the electrode 12a, solar cell element 13 and electrode 12b using metal masks in which the respective patterns are hollow-shaped and the laser patterning scheme is a method of forming a conductor film which becomes the basis of the electrode 12a on the surface of the substrate 11, then scanning the conductor film with a laser beam, forming a pattern of the electrode 12a and also forming the solar cell element 13 and electrode 12b through patterning in a similar way. Of course, both methods may be combined.

Here, as described above, the solar cell element 13 is not particularly limited as long as it demonstrates a photoelectric effect, and various publicly known types such as silicon type, compound semiconductor type, organic semiconductor type, wet type (liquid, liquid-like substance (liquid-like body), fluid) or type in which these types are dye-sensitized can be used. A solid type includes a crystalline type and amorphous type, and further, a monocrystalline type and polycrystalline type are known as the crystalline type. The figures assume a solid type solar cell element 13.

Taking amorphous silicon, which exists relatively abundantly in the natural world, can be manufactured relatively easily and provides excellent cost efficiency, as an example of the solar cell element 13, the substrate 11 made of stainless steel, glass or the like on which the electrodes 12a are formed are accommodated in a reaction chamber such as a vacuum chamber having electrodes for plasma discharge, the reaction chamber is filled with a silane ($SiH_4$) gas as a raw material gas, high frequency plasma discharge is performed, silane is thereby decomposed causing reaction between silicon atoms, amorphous silicon is deposited on the substrate 11 and a thin film is formed.

In this case, if, for example, a diborane ($B_2H_6$) gas is added to the silane gas, which is the raw material gas, p-type amorphous silicon is formed, and on the other hand, when, for example, a phosphine ($PH_3$) gas is added, n-type amorphous silicon is formed or i-type amorphous silicon is formed if a gas for generation of p-type or n-type is not added. The solar cell element 13 made of such amorphous silicon is often used as a multilayered element such as p-i-n-type or n-i-p-type, and a single chamber reaction scheme is used as the manufacturing method in this case whereby the raw material gas and a supply source for an additive gas are connected to a single reaction chamber and amorphous silicon in the respective layers is formed. Furthermore, from the standpoint of ease in preventing mixing of impurities, a serial separation chamber scheme (system) may also be adopted whereby respective reaction chambers for forming p-, i-, and n-type amorphous silicon are serially connected, and transfer of the substrate and formation of amorphous silicon are serially performed.

The variable light condensing apparatus 20 is provided on the solar cell section 10 where a translucent partition wall section 22 is disposed upright on a lower wall section 21 (translucent support) made of glass (having translucency) or acrylic plate or the like that allows light such as sunlight to penetrate and an upper wall section 23 is further provided thereon so as to cover the top thereof and a plurality of cells C are defined by these sections. Furthermore, a hydrophilic photocatalyst layer S is provided on the top surface (surface on the cell C side) of the lower wall section 21 in the figure.

Furthermore, a translucent liquid L1 (first translucent liquid) made of water or an aqueous solution as a polar solution (solvent) and a translucent liquid L2 (second translucent liquid) made of, for example, oil or non-polar solution (solvent) which has lighter specific gravity than that of the translucent liquid L1 and has non-affinity with the translucent liquid L1 are sealed in each cell C.

The hydrophilic photocatalyst layer S is formed into a film shape by including ultraviolet light or visible photoresponsive type hydrophilic photocatalyst (aforementioned $TiO_2$, $BaTiO_3$, $SrTiO_3$, $BaZrO_3$, $SrZrO_3$ or $Ge_3N_4$ doped or not doped with N, S or C), and when the solar cell apparatus 1 is set up so that the vertical direction in the figure corresponds to a plumb direction, a state is produced in which the translucent liquid L1 having greater specific gravity than that of the translucent liquid L2 contacts the hydrophilic photocatalyst layer S.

As for the method of forming the hydrophilic photocatalyst layer S, a method of applying an application liquid containing a hydrophilic photocatalyst onto the lower wall section 21 to form a film and then heat-treating or drying the film may be adopted. The method of applying the application liquid is not particularly restricted, and general methods such as a spin coating method, dip coating method, roll coating method, spray coating method, bar coating method or screen printing method may be adopted.

To be more specific, the following methods may be taken as examples: a method whereby, for example, titanium alkoxide which is a precursor of $TiO_2$ as the hydrophilic photocatalyst, titanium organate or a solution of titanous salt such as titanium peroxide, titanium chloride is applied onto the lower wall section 21 using the above described method and then heat-treated with a predetermined temperature gradient for a predetermined time (e.g., several hours to several tens of hours) at 100° C. to 700° C. (however, equal to or below a heat-resistant temperature of the lower wall section 21) or a method whereby a solution in which $TiO_2$ powder or sol, which is $TiO_2$ powder dispersed in a solvent, and an inorganic or organic binder (which may be bead-like) are mixed is applied onto the lower wall section 21 and then sintered or dried.

The thickness of the hydrophilic photocatalyst layer S may be such a thickness that the photocatalyst can manifest and maintain its active state and can be, for example, on the order of several tens of nm to several hundreds of nm and is preferably a thickness that provides high translucency with a fewer number of times of film formation.

In this case, as shown in FIG. 1, when incident light R1 such as sunlight impinges on the lower wall section 21 on which the hydrophilic photocatalyst layer S is formed from the upper wall section 23 of the variable light condensing apparatus 20 of the solar cell apparatus 1 at a large angle close to the right angle (angle close to 90°), the luminous flux density in the hydrophilic photocatalyst layer S increases, and when a case where the hydrophilic photocatalyst is $TiO_2$ is taken as an example, photochemical reaction takes place between the Ti atom that forms part of the molecule and the $H_2O$ molecule in the translucent liquid L1, which gives rise to an —OH group which is a polar group (hydrophilic group) on the surface of the hydrophilic photocatalyst layer S (however, the action is not limited to this). The affinity (wettability) between the lower wall section 21 on which the hydrophilic photocatalyst layer S is provided and the translucent liquid L1 is increased and the angle of contact between the surface of the lower wall section 21 and the translucent liquid L1 is reduced to, for example, several degrees or below.

This prevents the translucent liquid L1 from forming any water droplet that rises on the lower wall section 21, that is, not forming a lens shape, but causes the translucent liquid L1 to become spread and distributed in the cell C in the figure, and therefore the incident light R1 having a large luminous flux density penetrates the translucent liquid L1 and the lower wall section 21 without being bent in the translucent liquid L1. Therefore, the incident light R1 impinges on the solar cell element 13 of the solar cell section 10 without the luminous flux density decreasing, and therefore desired power is generated through a photoelectric effect (photovoltaic effect) thereof.

On the other hand, as shown in FIG. 2, when incident light R2 such as sunlight impinges on the lower wall section 21 on which the hydrophilic photocatalyst layer S is formed at a small angle close to the horizontal direction (angle close to 0° or 180°) from the upper wall section 23 of the variable light condensing apparatus 20 of the solar cell apparatus 1, the luminous flux density in the hydrophilic photocatalyst layer S decreases, and if a case where the hydrophilic photocatalyst is $TiO_2$ is taken as an example, no photochemical reaction takes place between the Ti atom that forms part of the molecule and the $H_2O$ molecule in the translucent liquid L1, and as a result, no —OH group, which is a polar group (hydrophilic group) is generated on the surface of the hydrophilic photocatalyst layer S (however, the action is not limited to this). The affinity (wettability) between the lower wall section 21 on which the hydrophilic photocatalyst layer S is provided and the translucent liquid L1 is not increased and the angle of contact between the surface of the lower wall section 21 and the translucent liquid L1 can be, for example, on the order of several degrees to several tens of degrees.

This causes the translucent liquid L1 to more easily form a water droplet on the lower wall section 21, that is, form a convex lens shape which rises and becomes distributed in the cell C as shown in the figure, and therefore the incident light R2 having a small luminous flux density is bent in the translucent liquid L1 and penetrates the translucent liquid L1 and the lower wall section 21 in a manner converging to the central part of the cell C. As a result, the incident light R2 impinges on the solar cell element 13 of the solar cell section 10 in a kind of condensed state, with the luminous flux density increased, and therefore more power is generated when compared to the case where no translucent liquid L1 exists.

Thus, according to the solar cell apparatus 1 provided with the variable light condensing apparatus 20, with an extremely simple configuration made up of the lower wall section 21 which is the translucent support having the hydrophilic photocatalyst layer S on its surface and the translucent liquid L2 supported on the surface of the lower wall section 21 in contact therewith, when the luminous flux density of light is sufficiently high as with the incident light R1, the translucent liquid L1 forms no condensing lens and the incident light R1 penetrates the incident light R1 as is without being bent, whereas when the luminous flux density of light is not sufficiently high as with the incident light R2, the translucent liquid L1 forms a condensing lens, and light penetrates the translucent liquid L1 by being bent and in a condensed state, and therefore it is possible to reduce the dependency of the light condensing efficiency on the angle of incidence of light and thereby improve the power generation efficiency of the solar cell apparatus 1.

Furthermore, since the configuration of the variable light condensing apparatus 20 can be extremely simplified, the configuration of the solar cell apparatus 1 can also be significantly simplified although it is of a condensing type, and it is thereby possible to realize space saving and high density mounting of the solar cell apparatus 1 and equipment such as a solar cell panel or module provided with a plurality of such solar cell apparatuses 1.

Furthermore, since the variable light condensing apparatus 20 of the solar cell apparatus 1 is provided with the cell C defined by the lower wall section 21, partition wall section 22 and upper wall section 23, it is possible to seal the translucent liquid L1 within the cell C, suppress vaporization thereof and facilitate the reuse thereof.

Furthermore, since the translucent liquid L2 having lighter specific gravity than that of the translucent liquid L1 and having non-affinity with the translucent liquid L1 is sealed in the cell C together with the translucent liquid L1, the translucent liquid L1 is covered with the translucent liquid L2, which prevents the translucent liquid L1 from vaporizing in the space of the cell C and can further reshape the translucent liquid L1 more easily.

FIG. 3 is a cross-sectional view schematically illustrating a configuration of another preferable embodiment of the solar cell apparatus using another example of the variable light condensing apparatus of the present disclosure and illustrates a situation in which light such as sunlight impinges on the apparatus from diagonally above in the figure as in the case shown in FIG. 2.

A solar cell apparatus 3 shown in the figure has a configuration similar to that of the solar cell apparatus 1 shown in FIG. 1 and FIG. 2 except in that the solar cell apparatus 3 is provided with a variable light condensing apparatus 30 instead of the variable light condensing apparatus 20. In the variable light condensing apparatus 20, the hydrophilic photocatalyst layer S is formed on the top surface of the lower wall section 21 and the partition wall section 22 and the upper wall section 23 are provided thereon, whereas in the variable light condensing apparatus 30, a hydrophilic photocatalyst layer T is formed on the top surface of a lower wall section 31 (translucent support) and on the side and the top surface of a partition wall section 32 (translucent support) disposed upright from the lower wall section 31 thereof and an upper wall section 33 is provided so as to cover the top thereof. For the hydrophilic photocatalyst layer T, one of the same kind (having similar properties) as the hydrophilic photocatalyst layer S may be used and the lower wall section 31, partition wall section 32 and upper wall section 33 have translucency in the same way as the lower wall section 21, partition wall section 22 and upper wall section 23.

Furthermore, in the variable light condensing apparatus 20, each cell C defined by the lower wall section 21, partition wall section 22 and upper wall section 23 is provided in a plurality of solar cell elements 13, whereas in the variable light condensing apparatus 30, each cell D defined by the lower wall section 31, partition wall section 32 and upper wall section 33 is provided in each of the individual solar cell elements 13.

In the solar cell apparatus 3 configured as shown above, when incident light R2 such as sunlight impinges on the lower wall section 31 on which the hydrophilic photocatalyst layer T is formed from the upper wall section 33 of the variable light condensing apparatus 30 at a small angle close to the horizontal direction (angle close to 0° or 180°) as shown in FIG. 3, the affinity between the lower wall section 31 provided with the hydrophilic photocatalyst layer T and the translucent liquid L1 is not increased as with the mechanism shown in FIG. 2, the angle of contact therebetween increases, and the translucent liquid L1 in the cell D is formed into a convex lens shape, rises and becomes distributed. As a result, the incident light R2 having a small luminous flux density is bent in the translucent liquid L1, condensed on the central part of the cell D, impinges on the solar cell element 13 of the solar cell section 10 with the luminous flux density increased, and therefore a greater amount of power is generated compared to the case where there is no translucent liquid L1.

On the other hand, though not illustrated, as shown in FIG. 1, when the incident light R1 such as sunlight impinges on the lower wall section 31 on which the hydrophilic photocatalyst layer T is formed from the upper wall section 33 of the variable light condensing apparatus 30 at a large angle close to the vertical direction (angle close to 90°), the affinity between the lower wall section 31 provided with the hydrophilic photocatalyst layer T and the translucent liquid L1 is increased as with the mechanism shown in FIG. 1, the angle of contact therebetween is reduced, the translucent liquid L1 in the cell D becomes distributed flatly without being formed into a convex lens shape. As a result, the incident light R1 having the large luminous flux density is not bent in the translucent liquid L1 and impinges on the solar cell element 13 of the solar cell section 10 with the same luminous flux density, and therefore a desired large amount of power can be generated.

As described above, the present disclosure is not limited to the above described embodiments but various modifications may be made as appropriate without departing from the spirit and scope thereof. For example, the translucent liquid L2 may not necessarily be accommodated in the cell C or D. Furthermore, the cell C or D need not be defined by providing the partition wall section 22 or 32 and upper wall section 23 or 33. Furthermore, the cell C in the solar cell apparatus 1 may be provided in each of the individual solar cell elements 13 and the cell D in the solar cell apparatus 3 may be provided in a plurality of solar cell elements 13.

Furthermore, the partition wall section 22 and the upper wall section 23 may also be formed as a single piece as shown in FIG. 1 and FIG. 2, and in this case, for example, it is possible to adopt a processing method of pressing a mold member having a convex part of the shape of the cell C against a not hardened translucent material, then hardening the translucent material or defining the shape of the cell C by applying dry etching, wet etching, milling or the like to a translucent member having a uniform thickness (total thickness of the partition wall section 22 and upper wall section 23) using a lithography technique such as photolithography. Alternatively, the partition wall section 22 and upper wall section 23 may be provided separately, and in this case, for example, the curb-like partition wall section 22 and the upper wall section 23 of uniform thickness can be connected together using an appropriate method. The same applies to the lower wall section 31 and partition wall section 32. In addition, in FIG. 2 and FIG. 3, the shape of the translucent liquid L1 (contact angle or the like) is not limited to that shown in the figures.

INDUSTRIAL APPLICABILITY

As described above, the variable light condensing apparatus and solar cell apparatus according to the present disclosure can reduce the dependency of the light condensing efficiency on the angle of incidence of light and improve power generation efficiency of the solar cell apparatus in a simple configuration, and is therefore widely applicable to many applications such as various types of solar cell apparatuses, equipment such as solar cell panel or module provided with a plurality of such solar cell apparatuses, and mobile units using a solar cell apparatus such as solar cars, solar power generation type roof tiles and outdoor power supplies and so on.

Figure 1:
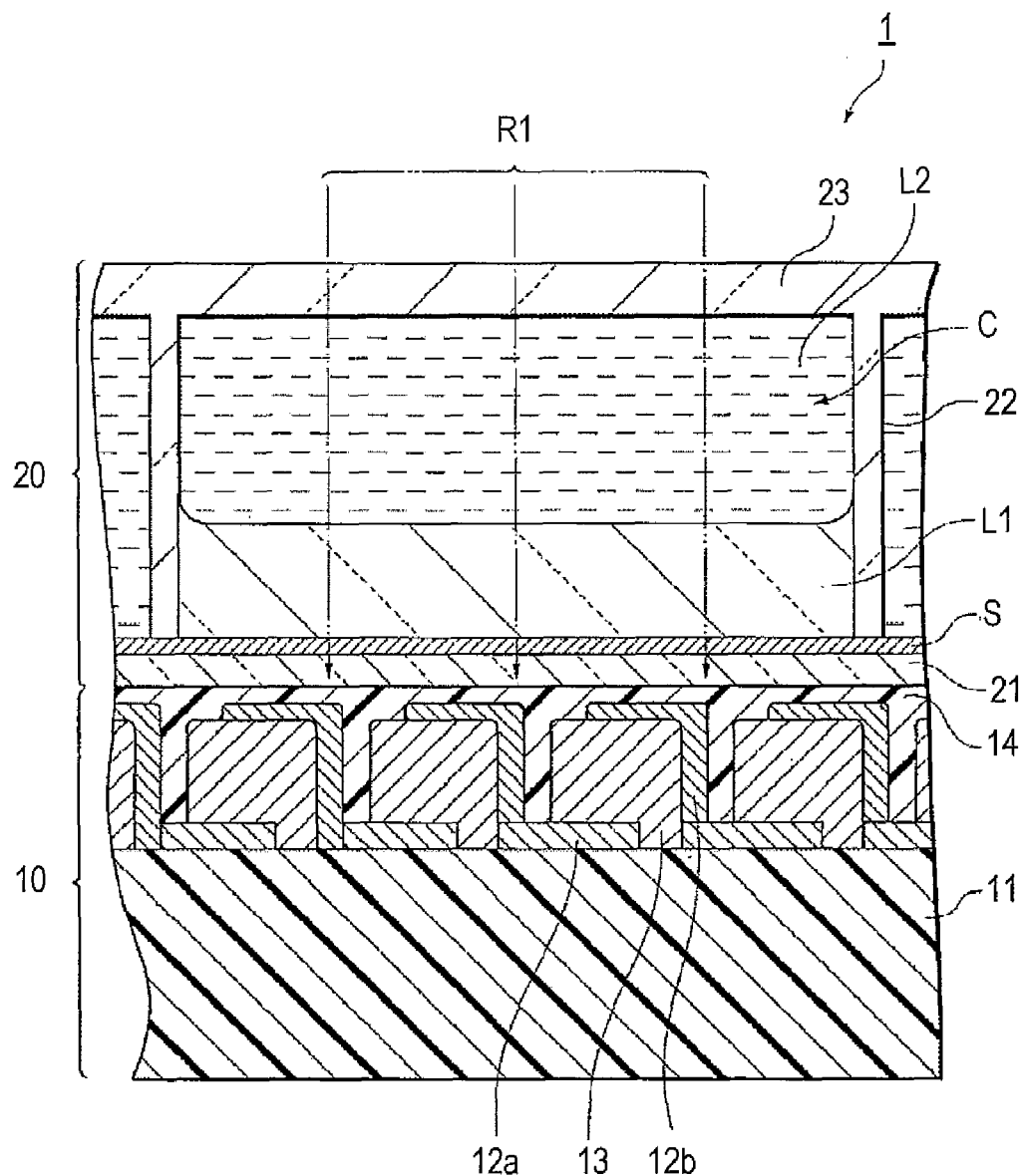
FIG. 1 is a cross-sectional view schematically illustrating a configuration of a preferred embodiment of a solar cell apparatus using an example of a variable light condensing apparatus according to the present disclosure and illustrates a situation in which light such as sunlight impinges on the apparatus from substantially right above in the figure.
Figure 2:
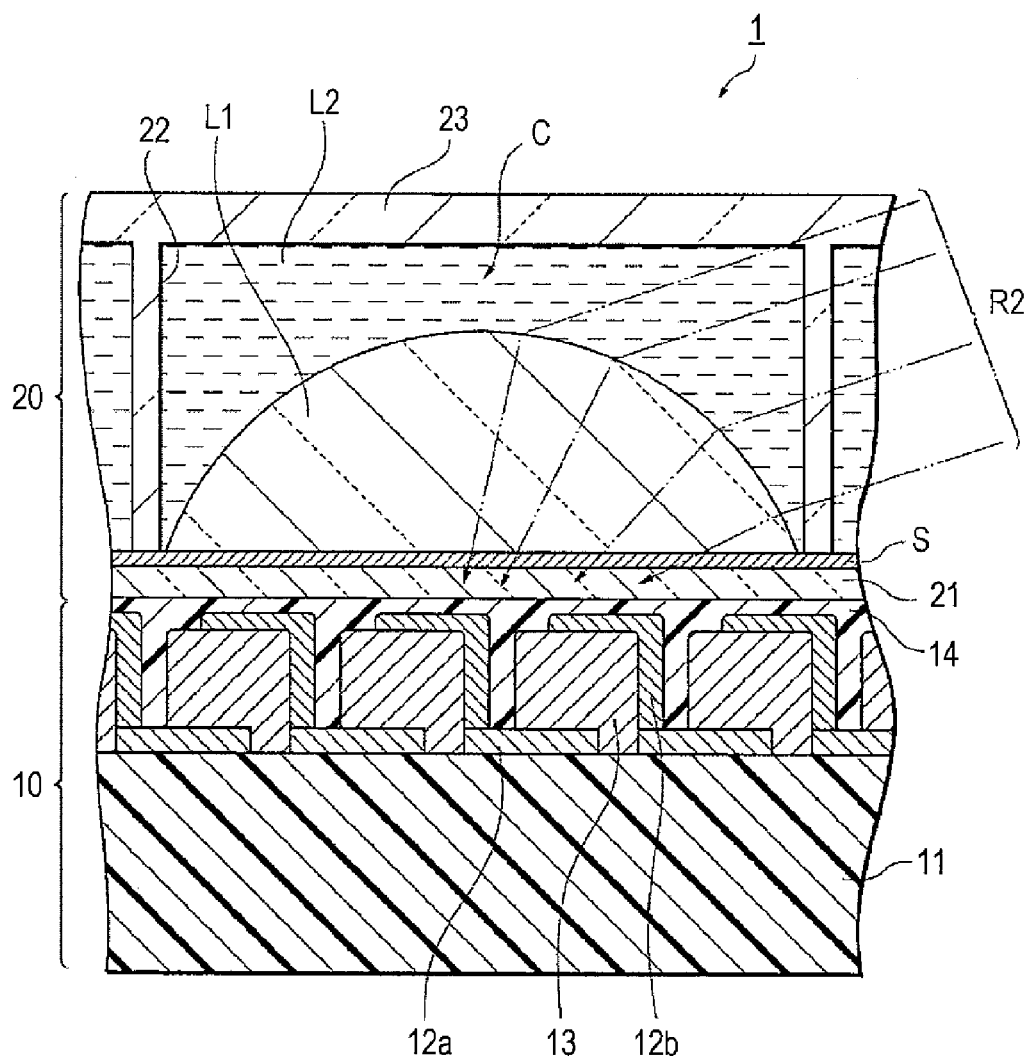
FIG. 2 is a cross-sectional view schematically illustrating a configuration of another preferred embodiment of the solar cell apparatus using another example of the variable light condensing apparatus according to the present disclosure and illustrates a situation in which light such as sunlight impinges on the apparatus from diagonally above in the figure.
Figure 3:
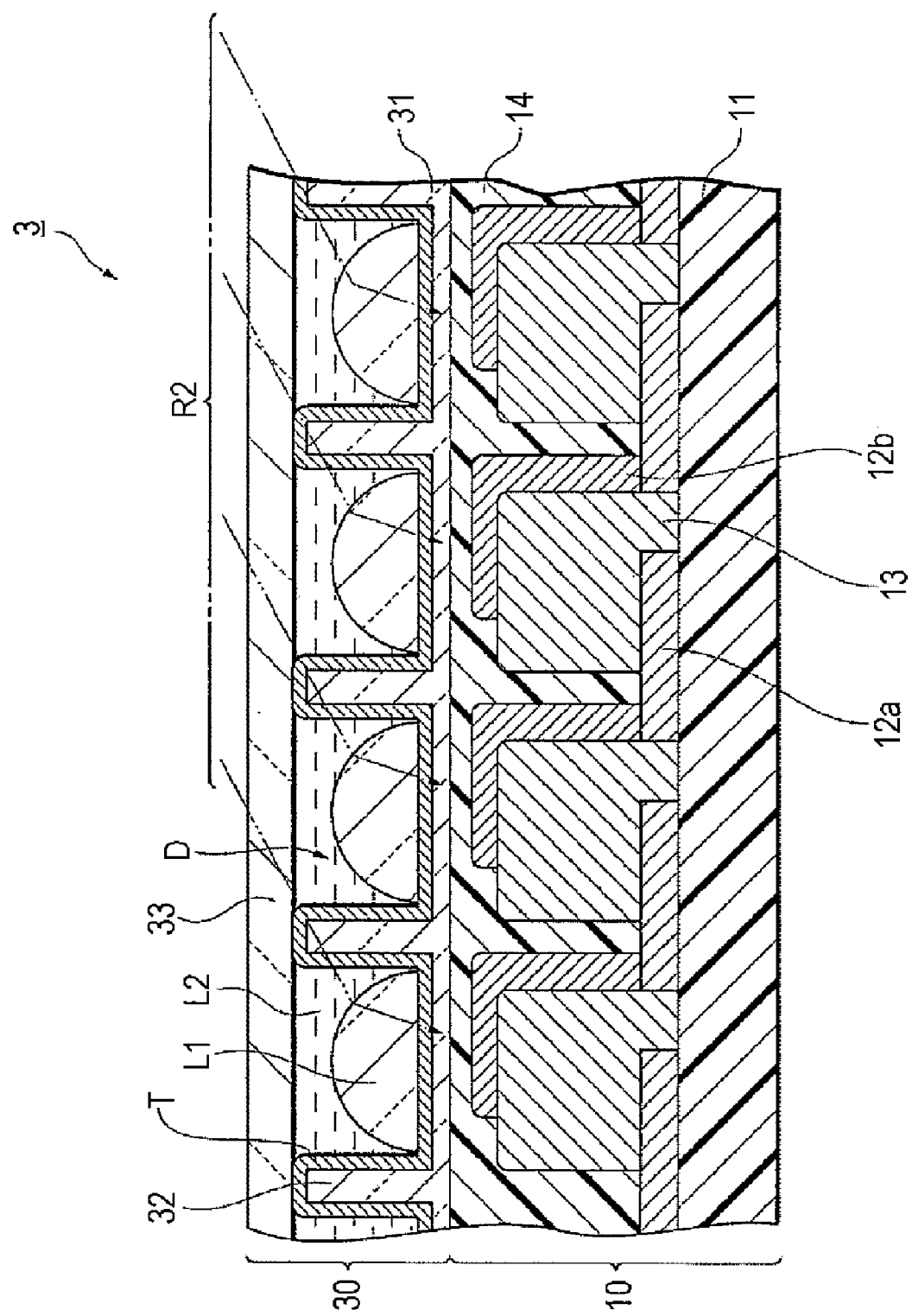
FIG. 3 is a cross-sectional view schematically illustrating a configuration of a further preferred embodiment of the solar cell apparatus using a further example of the variable light condensing apparatus according to the present disclosure and illustrates a situation in which light such as sunlight impinges on the apparatus from diagonally above in the figure.

The invention claimed is:
1. A solar cell apparatus comprising:
a solar cell element;
a pair of electrodes connected to the solar cell element;
a variable light condensing apparatus comprising a translucent support having a hydrophilic photocatalyst on a surface thereof and a first translucent liquid supported on the surface of the translucent support in contact therewith, and disposed opposed to the solar cell element, wherein the hydrophilic photocatalyst is $TiO_2$, $BaTiO_3$, $SrTiO_3$, $BaZrO_3$, $SrZrO_3$ or $Ge_3N_4$ doped or not doped with N, S or C and hydrophilicity thereof increases when irradiated with light having a predetermined wavelength compared to when not irradiated with such light, and the first translucent liquid is water or an aqueous solution and does not form any condensing lens when the hydrophilic photocatalyst is irradiated with light at a predetermined luminous flux density or higher, whereas the first translucent liquid forms a condensing lens when the hydrophilic photocatalyst is irradiated with light at less than the predetermined luminous flux density.

2. A variable light condensing apparatus comprising:
a translucent support having a hydrophilic photocatalyst on a surface thereof; and
a first translucent liquid supported on the surface of the translucent support in contact therewith,
wherein the hydrophilic photocatalyst has improved hydrophilicity when irradiated with light having a predetermined wavelength compared to when not irradiated with the light, and
the first translucent liquid does not form any condensing lens when the hydrophilic photocatalyst is irradiated with the light at a predetermined luminous flux density or higher, whereas the first translucent liquid forms a condensing lens when the hydrophilic photocatalyst is irradiated with the light at less than the predetermined luminous flux density.

3. The variable light condensing apparatus according to claim 2, further comprising a cell including the translucent support.

4. The variable light condensing apparatus according to claim 2, wherein the first translucent liquid is water or an aqueous solution.

5. The variable light condensing apparatus according to claim 2, further comprising a second translucent liquid having lighter specific gravity than that of the first translucent liquid, having non-affinity with the first translucent liquid and contacting the first translucent liquid.

6. The variable light condensing apparatus according to claim 5, wherein the second translucent liquid is an oil or a non-polar solvent.

7. The variable light condensing apparatus according to claim 2, wherein the light has a wavelength in an ultraviolet region, and
the hydrophilic photocatalyst is of an ultraviolet photoresponsive type.

8. The variable light condensing apparatus according to claim 2, wherein the light has a wavelength in a visible region, and
the hydrophilic photocatalyst is of a visible photoresponsive type.

9. The variable light condensing apparatus according to claim 2, wherein the hydrophilic photocatalyst is $TiO_2$, $BaTiO_3$, $SrTiO_3$, $BaZrO_3$, $SrZrO_3$ or $Ge_3N_4$ doped or not doped with N, S or C.

10. A solar cell apparatus comprising:
a solar cell element;
a pair of electrodes connected to the solar cell element; and
a variable light condensing apparatus: comprising a support having a hydrophilic photocatalyst on a surface thereof and a first translucent liquid supported on the surface of the support in contact therewith, wherein the hydrophilic photocatalyst has improved hydrophilicity when irradiated with light having a predetermined wavelength compared to when not irradiated with the light, and the first translucent liquid does not form any condensing lens when the hydrophilic photocatalyst is irradiated with the light at a predetermined luminous flux density or higher, whereas the first translucent liquid forms a condensing lens when the hydrophilic photocatalyst is irradiated with the light at less than the predetermined luminous flux density; and disposed opposed to the solar cell element.

11. A light condensing method for causing light to converge by using a translucent support having a hydrophilic photocatalyst on a surface thereof and a first translucent liquid supported on the surface of the translucent support in contact therewith,
wherein the hydrophilic photocatalyst has improved hydrophilicity when irradiated with light having a predetermined wavelength compared to when not irradiated with the light, and
the first translucent liquid does not form any condensing lens when the hydrophilic photocatalyst is irradiated with the light at a predetermined luminous flux density or higher, whereas the first translucent liquid forms a condensing lens when the hydrophilic photocatalyst is irradiated with the light at less than the predetermined luminous flux density.

* * * * *

UNITED STATES PATENT AND TRADEMARK OFFICE
CERTIFICATE OF CORRECTION

PATENT NO. : 8,058,548 B2
APPLICATION NO. : 12/665015
DATED : November 15, 2011
INVENTOR(S) : Takahisa Kusuura It is certified that error appears in the above-identified patent and that said Letters Patent is hereby corrected as shown below:

On the Title Page, in Item (56), under "OTHER PUBLICATIONS", in Column 2, Line 15, delete "/kagaku01/" and insert -- /kagaku04/ --, therefor.

In the Specification

In Column 1, Line 41, delete "3-5.htm" and insert -- 3-5.htm, --, therefor.

In Column 1, Line 42, delete "2009)" and insert -- 2009). --, therefor.

In Column 7, Line 8, delete "sol," and insert -- sol., --, therefor.

Signed and Sealed this
First Day of October, 2013

Teresa Stanek Rea
*Deputy Director of the United States Patent and Trademark Office*